(12) United States Patent
Choi et al.

(10) Patent No.: US 8,785,263 B2
(45) Date of Patent: Jul. 22, 2014

(54) THIN-FILM TRANSISTOR SUBSTRATE AND METHOD OF MANUFACTURING THE SAME

(71) Applicant: Samsung Display Co., Ltd., Yongin (KR)

(72) Inventors: Tae-Young Choi, Seoul (KR); Bo-Sung Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 4 days.

(21) Appl. No.: 13/652,967

(22) Filed: Oct. 16, 2012

(65) Prior Publication Data
US 2013/0328049 A1    Dec. 12, 2013

(30) Foreign Application Priority Data
Jun. 11, 2012   (KR) .................. 10-2012-0062190

(51) Int. Cl.
*H01L 21/00*          (2006.01)
(52) U.S. Cl.
USPC .................................. 438/158; 257/E21.414
(58) Field of Classification Search
USPC .................. 438/158; 257/59, 72, E21.414
See application file for complete search history.

(56) References Cited

U.S. PATENT DOCUMENTS 7,759,180 B2 *   7/2010   Kim et al. ............. 438/161

FOREIGN PATENT DOCUMENTS

| JP | 2007305534 A | 11/2007 |
| JP | 4235921 A | 12/2008 |
| JP | 4452528 A | 2/2010 |
| KR | 10-0719569 A | 5/2007 |
| KR | 10-1020629 A | 3/2011 |
| KR | 1020110063052 A | 6/2011 |
| KR | 1020110111122 A | 10/2011 |

* cited by examiner

*Primary Examiner* — Mark Prenty
(74) *Attorney, Agent, or Firm* — Cantor Colburn LLP (57) ABSTRACT

A thin-film transistor substrate includes a gate line, and a gate electrode connected to the gate line, on a base substrate; an insulating layer on the gate electrode, the insulating layer including a first part and a second part, the first part having a hydrophobic property and the second part having a hydrophilic property; a data line extended in a different direction from the gate line, and a source electrode connected to the data line and on the second part of the insulating layer; a drain electrode on the second part of the insulating layer, the drain electrode spaced apart from the source electrode; a semi-conductor pattern overlapping the source electrode, the drain electrode and a gap between the spaced apart source and drain electrodes, where the semi-conductor pattern exposes the first part of the insulating layer; and a pixel electrode in contact with the drain electrode.

12 Claims, 10 Drawing Sheets

THIN-FILM TRANSISTOR SUBSTRATE AND METHOD OF MANUFACTURING THE SAME

This application claims priority to Korean Patent Application No. 10-2012-0062190, filed on Jun. 11, 2012, and all the benefits accruing therefrom under 35 U.S.C. §119, the contents of which are herein incorporated by reference in its entirety.

BACKGROUND

1. Field

Exemplary embodiments of the invention relate to a thin-film transistor substrate and a method of manufacturing the thin-film transistor substrate. More particularly, exemplary embodiments of the invention relate a thin-film transistor substrate including a solution type semi-conductor and a method of manufacturing the thin-film transistor substrate.

2. Description of the Related Art

Generally, a thin-film transistor includes a gate electrode connected to a gate line, a source electrode connected to a data line, a drain electrode spaced apart from the source electrode, and a semi-conductor pattern activated by the gate electrode. The semi-conductor pattern may be formed by forming a semi-conductor layer and patterning the semi-conductor layer by a photo-etching process.

For improving an electrical material of the thin-film transistor, the semi-conductor layer is formed by an organic material and an oxide material instead of silicon material. In a process of forming a semi-conductor pattern, to protect the oxide material from a damage, patterning process for thin film is not proceeded and an ink including the organic material or the oxide material is jetted to a part of an area facing the semi-conductor pattern to manufactured the semi-conductor pattern.

When a solution type semi-conductor pattern is formed by an ink-jetting method, the process is simpler than forming a semi-conductor pattern by using a photo-etching process. Also, the damage of the organic material or the oxide material is minimized. In the ink-jetting method, even though the ink is jetted onto a particular area of a substrate, the ink undesirably spreads from the particular area, so that a bank is required for restricting movement of and containing the ink for keeping the jetted ink on a particular area.

Furthermore, even though the ink-jetting method is used, an additional process for forming the bank is needed and the thickness of the semi-conductor pattern, which remains after drying a solvent of the ink, is remarkably thinner than a thickness of the bank. Because of the difference of the thicknesses, the reliability of the additional process may be reduced. Furthermore, the thickness of a display substrate including the thin-film transistor is increased by the bank, so that an overall thickness of a display device including the display substrate may be undesirably increased.

SUMMARY

One or more exemplary embodiment of the invention provides a thin-film transistor substrate including a solution type semi-conductor pattern formed by an ink-jetting method without using a bank.

One or more exemplary embodiment of the invention also provides a method of manufacturing the thin-film transistor substrate.

An exemplary embodiment of a thin-film transistor according to the invention includes a gate line, and a gate electrode connected to the gate line, on a base substrate; an insulating layer on the gate electrode, the insulating layer including a first part and a second part, the first part having a hydrophobic property and the second part having a hydrophilic property; a data line extended in a different direction from the gate line, and a source electrode connected to the data line and on the second part of the insulating layer; a drain electrode on the second part of the insulating layer, the drain electrode spaced apart from the source electrode; a semi-conductor pattern overlapping the source electrode, the drain electrode and a gap between the spaced apart source and drain electrodes, the semi-conductor pattern exposing the first part of the insulating layer; and a pixel electrode in contact with the drain electrode.

In an exemplary embodiment, the first part may include a fluorine ion.

In an exemplary embodiment, a surface area of the second part may be substantially equal to or larger than the summation of surface area of the source electrode and, a surface area of the drain electrode and a surface area of the gap.

In an exemplary embodiment, the semi-conductor may have a planar shape including a rounded corner.

In an exemplary embodiment, the semi-conductor pattern partially may cover the data line.

An exemplary embodiment of a thin-film transistor according to the invention includes a gate line, and a gate electrode connected to the gate line, on a base substrate; an insulating layer on the gate electrode; a data line extended in a direction crossing the gate line, and a source electrode connected to the data line and on the insulating layer and the gate electrode; a drain electrode on the insulating layer, the drain electrode spaced apart from the source electrode; a semi-conductor pattern overlapping the source electrode, the drain electrode and a gap between the spaced apart source and drain electrodes, where the semi-conductor pattern exposes a portion of the insulating layer; a hydrophobic pattern on the exposed portion of the insulating layer and surrounding a peripheral region of the semi-conductor pattern; and a pixel electrode in contact with the drain.

In an exemplary embodiment, the hydrophobic pattern may include a self-assembly monolayer ("SAM").

In an exemplary embodiment of the invention, a method of the manufacturing a thin film transistor substrate is provided. The method of the manufacturing a thin-film transistor substrate includes providing a gate line, and a gate electrode connected to the gate line, on a base substrate; providing an insulating layer on the base substrate having the gate line and the gate electrode thereon; providing a data line and an electrode pattern on the base substrate having the insulating layer thereon, the data line extended in a direction crossing the gate line and the electrode pattern connected to the data line; hydrophobic-treating a surface of the insulating layer by using the data line and the electrode pattern as a mask; providing a source electrode and a drain electrode from the electrode pattern, the source electrode connected to the data line and the drain electrode spaced apart from the source electrode; providing a semi-conductor pattern overlapping the source electrode, the drain electrode and a gap between the spaced apart source and drain electrodes; and providing a pixel electrode on the base substrate having the semi-conductor pattern thereon, the pixel electrode connected to the drain electrode.

In an exemplary embodiment, an electrode layer may be formed on the base substrate having the insulating layer. A sacrificing metal layer may be formed on the base substrate having the electrode layer. The sacrificing metal layer and the electrode layer are etched by using a photo pattern as an etching mask, and the photo pattern may be formed on the sacrificing metal layer.

In an exemplary embodiment, a portion of the photo pattern is removed to form a remaining pattern. The sacrificing metal layer of the electrode pattern is etched by using the remaining pattern as an etching mask to form sacrificing electrodes spaced apart from each other. The sacrificing electrodes are used as an etching mask to etch the electrode layer of the electrode pattern.

In an exemplary embodiment, the photo pattern may include a first thickness portion, and the remaining pattern may include a second thickness portion which is thinner than the first thickness. The second thickness portion of the remaining pattern is removed to expose the sacrificing metal layer at the gap.

In an exemplary embodiment, after forming the source electrode and the drain electrode by etching the electrode layer of the electrode pattern, the sacrificing electrode may be removed.

In an exemplary embodiment, the surface of the insulating layer exposed by the electrode pattern is hydrophobic-treated to form a first part, the first part having the thickness which is thinner than or equal to the total thickness of the insulating layer and has a hydrophobic property, and a portion of the insulating layer under the electrode pattern have the hydrophilic property.

In an exemplary embodiment, for hydrophobic-treating a surface of the insulating layer exposed by the electrode pattern may be treated by fluorine plasma.

In an exemplary embodiment, a portion of the insulating layer under of the first part may have the hydrophilic property, where the thickness of the first part is thinner than the total thickness of the insulating layer.

In an exemplary embodiment, for hydrophobic-treating a surface of the insulating layer, the hydrophobic pattern may be formed on the surface of the insulating layer exposed by the electrode pattern. The hydrophobic-pattern may include the SAM.

In an exemplary embodiment, a semi-conductor solution is deposited on the base substrate having the source electrode and the drain electrode. The deposited semi-conductor solution on the base substrate is thermal-treated. Thus, the semi-conductor pattern may be formed.

In an exemplary embodiment, the semi-conductor solution may cover the source electrode, the drain electrode and the gap, and a portion of the semi-conductor may spread toward the data line.

According to one or more exemplary embodiment of the thin-film transistor substrate and the method of manufacturing the thin-film transistor, a solution type semi-conductor pattern may be easily manufactured without employing a bank. Thus, a process of the manufacturing a thin-film transistor substrate may be simplified and increasing of the total thickness of a thin-film transistor substrate is reduced or effectively prevented.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 1:
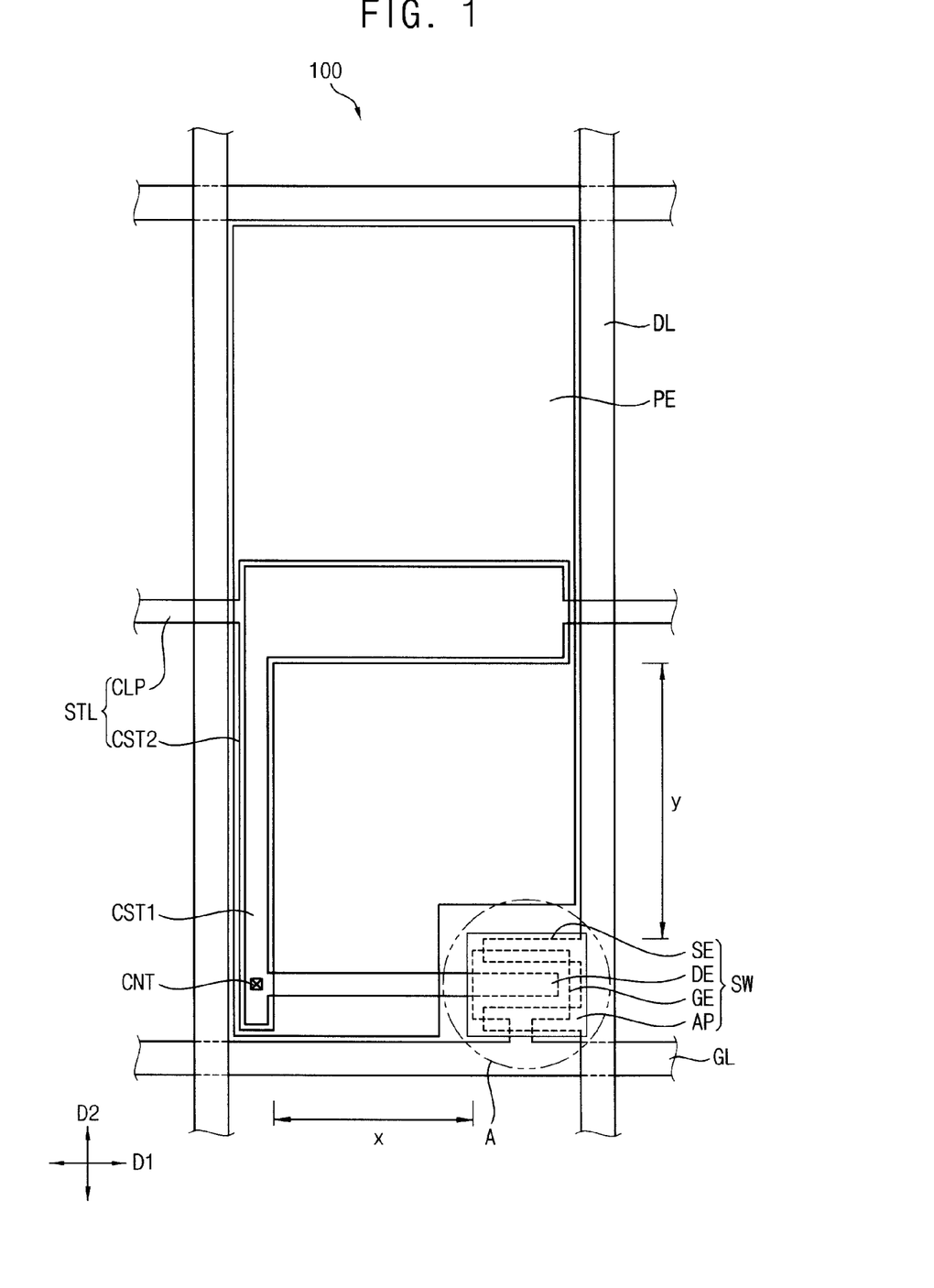
FIG. 1 is a plan view illustrating an exemplary embodiment of a thin-film transistor substrate according to the invention.

FIG. 1 is a plan view illustrating an exemplary embodiment of a thin-film transistor substrate according to the invention.

Referring to FIG. 1, the thin-film transistor substrate 100 includes a gate line GL, a data line DL, a thin-film transistor SW and a pixel electrode PE. The thin-film transistor substrate 100 may further include a storage line STL including a second storage electrode CST2 which is overlapped with a first storage electrode CST1.

The gate line GL has a longitudinal axis which is extended in a direction D1 of the thin-film transistor substrate 100, and is connected to a gate electrode GE of the thin-film transistor SW. The data line DL has a longitudinal axis which is extended in a second direction D2 being extended in different direction from the first direction D1, and is connected to a source electrode SE of the thin-film transistor SW. The gate electrode GE and the source electrode SE are continuous with and extended from the gate line GL and the data line DL, such that the gate electrode GE and the source electrode SE are connected to the gate line GL and the data line DL, respectively.

The thin-film transistor SW includes the gate electrode GE and the source electrode SE, a drain electrode DE and a semi-conductor pattern AP. The source electrode SE is partially overlapped with the gate electrode GE. The drain electrode DE is partially overlapped with the gate electrode GE, and the drain electrode DE spaced apart from the source electrode SE. A portion of the drain electrode DE is connected to the first storage electrode CST1. The drain electrode DE is continuous with and extended from the first storage electrode CST1 such that the drain electrode DE is connected to the first storage electrode CST1. The semi-conductor pattern AP may be disposed on an area having the gate electrode GE and be overlapped with the source electrode SE and the drain electrode DE. The semi-conductor pattern AP will be described further referring to FIG. 2 and FIG. 3.

The pixel electrode PE may be disposed on an area. In the area, the gate line GL is extended in a different direction from the data line DL, but is not limited thereto or thereby. The pixel electrode PE may be partially overlapped with the storage line STL. The pixel electrode PE is connected to the thin-film transistor SW through a contact hole CNT. Namely, the pixel electrode PE may physically and/or electrically contact the drain electrode DE through the contact hole CNT.

The storage line STL may include the second storage electrode CST2 which is overlapped with the first storage electrode CST1, and may further include a connection line part CLP. By the connection line part CLP, second storage electrodes CST2 which are disposed in different pixels of the thin-film transistor substrate 100 may be physically and/or electrically connected each other. The second storage electrode CST2 may be spaced apart from the thin-film transistor SW by a first distance 'x' in a first direction D1, and may be spaced apart from the thin-film transistor SW by a second distance 'y' in a second direction D2.

In forming the semi-conductor pattern AP, when the first distance and the second distance 'x' and 'y' are small and the second storage electrode CST2 is close to the thin-film transistor SW, material for the semi-conductor pattern AP of the thin film transistor SW spread towards the first storage electrode CST1, so that the reliability of manufacturing the semi-conductor pattern AP is reduced. Thus, each of the first distance and the second distance 'x' and 'y' may be at least more than about 20 microns (μm). In one exemplary embodiment, for example, when the first distance 'x' and the second distance 'y' have a sufficient distance, the semi-conductor pattern AP may be stably formed on a position to overlap with the gate electrode GE, the position having the thin-film transistor SW.

In one exemplary embodiment, for example, when a planar width×length size of the pixel of the thin-film transistor substrate 100 is about 84 μm×252 μm, the first distance 'x' may be at least more than about 25 μm and the second distance 'y' may be at least more than about 90 μm.

Hereinafter, a plan view structure and a cross-sectional structure of the thin-film transistor SW is further explained referring to FIGS. 2 and 3 in detail.

Figure 2:
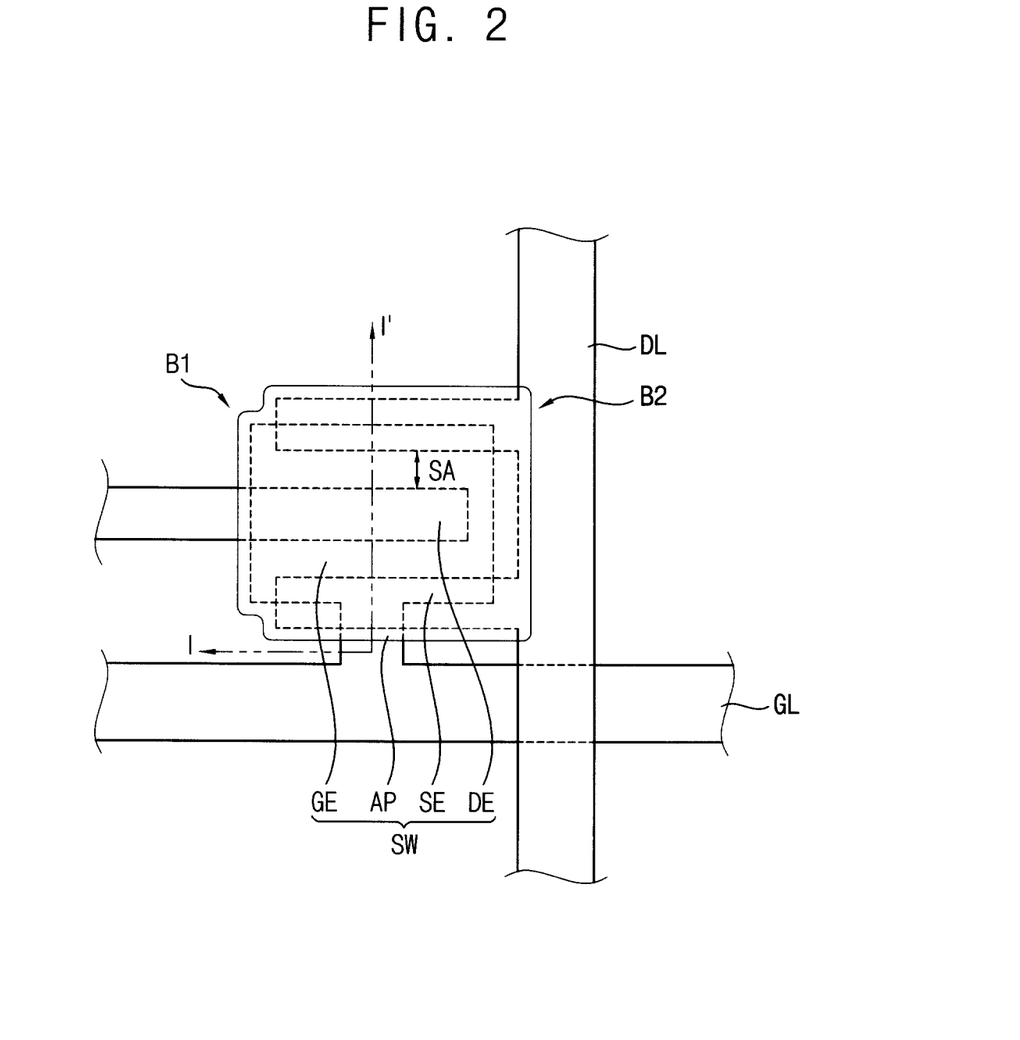
FIG. 2 is a enlarged plan view illustrating portion 'A' illustrated in FIG. 1.
Figure 3:
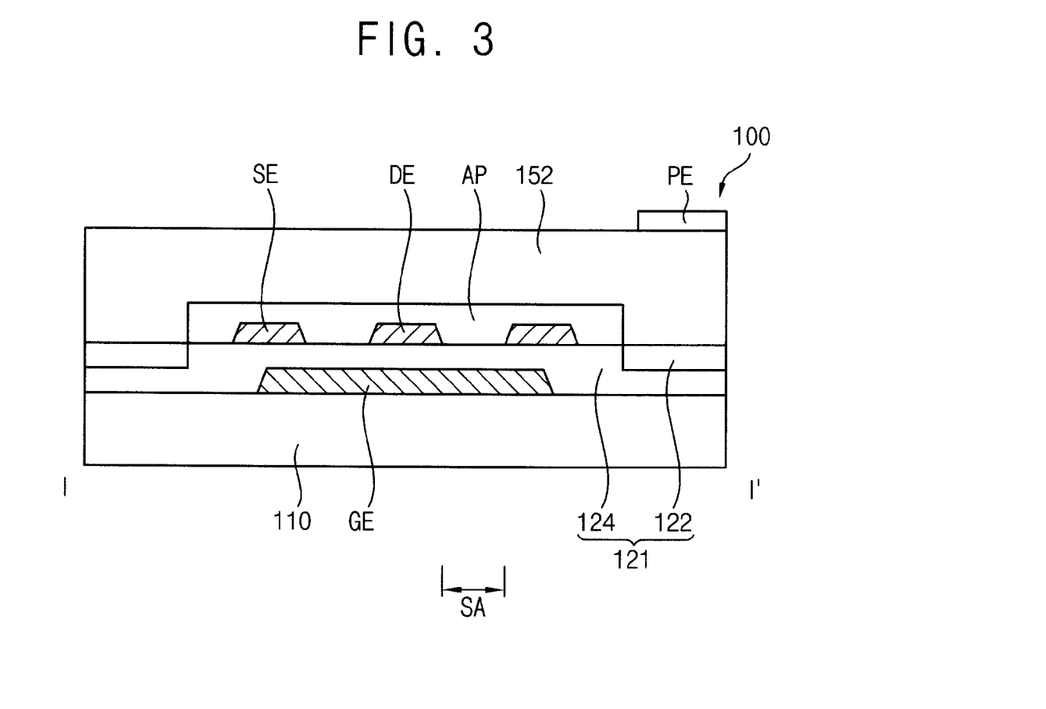
FIG. 3 is a cross-sectional view taken along line I-I' of FIG. 2.

FIG. 2 is a enlarged plan view illustrating portion 'A' illustrated in FIG. 1, and FIG. 3 is a cross-sectional view taken along line I-I' of FIG. 2.

Referring to FIGS. 2 and 3, the semi-conductor pattern AP is overlapped with the gate electrode GE, and the semi-conductor pattern AP has a planar shape which extends along each outline or outermost edge of the source electrode SE and the drain electrode DE. The semi-conductor pattern AP may have a planar shape which has a rounded corner, but is not limited thereto or thereby. In an exemplary embodiment, the semi-conductor pattern AP may be formed by an ink to have the planar shape, which includes rounded corners B1 and B2. Therefore, the semi-conductor pattern AP formed by an ink in an ink-jetting process may be different from a shape of pattern patterned by a photo etching process. The rounded corner B1 may be at an area where outermost edges of the gate electrode GE and the source electrode SE meet each other. The rounded corner B2 may be at an area overlapping a width of the data line DL where an outermost edge of the data line DL and source electrode SE meet each other.

Furthermore, the semi-conductor pattern AP is formed by the ink in an ink jetting process, so that the semi-conductor pattern AP is disposed on an area having hydrophilic material. In one exemplary embodiment, for example, the semi-conductor pattern AP is disposed on an area having the source electrode SE, the drain electrode DE, and a gap SA which is between the source electrode SE and drain electrode DE. Thus, the semi-conductor pattern AP may cover (e.g., overlap) the source electrode SE, the drain electrode DE and the gap SA.

The thin-film transistor substrate 100 includes an insulating layer 121 which insulates the gate electrode GE from each of the source electrode SE and the drain electrode DE, respectively. The insulating layer 121 includes a first part 122 which has hydrophobic material, and a second part 124 which has hydrophilic material.

The semi-conductor pattern AP is on the second part 124. Furthermore, at least of a portion of the source electrode SE and the drain electrode DE is on the second part 124. The first part 122 surrounds the second part 124 in the plan view, and the first part 122 may define a remaining planar area of the insulating layer 121 except for the second part 124, but is not limited thereto or thereby. A portion of the second part 124 may be extended under the first part 122. In one exemplary embodiment, for example, as illustrated in FIG. 3, the first part 122 has a thickness taken perpendicular to a base substrate 110, which is less than a whole thickness of the insulating layer 121. Furthermore, the first part 122 may be on the second part 124, and a portion of the second part 124 may be disposed under the first part 122. Particularly, a portion of the second part 124 which is overlapped with the semi-conductor pattern AP has a thickness which is substantially equal to the whole thickness of the insulating layer 121, while a portion of the second part 124 which is overlapped with the first part 122 has a thickness which is less than the whole thickness of the insulating layer 121. In detail, a thickness of the second part 124 overlapped with the first part 122 has a thickness which is a difference between the whole thickness of the insulating layer 121 and a thickness of only the first part 122.

Therefore, the first part 122 may be spaced apart from the base substrate 110 and contact with an over-coating layer 152, and the portion of the second part 124 overlapping the semi-conductor pattern AP may be spaced apart from the over-coating layer 152 and contact the base substrate 110.

In a method of forming the thin-film transistor substrate 100, at first, the insulating layer 121 may have a substantially identical material with the second part 124. However, by a hydrophobic-treating process, the first part 122 of the insulating layer 121 may be formed from the material. In one exemplary embodiment, for example, the second part 124 may be relatively defined as a portion of the insulating layer 121 by forming the first part 122.

In one exemplary embodiment, the first part 122 of the insulating layer 121 may be formed by a hydrophobic-treating process using fluorine plasma, but is not limited thereto or thereby. The first part 122 may include a fluorine ion or a plurality of fluorine ions. In one exemplary embodiment, for example, the second part 124 of the insulating layer 121 may include an inorganic material including a silicon oxide, a silicon nitride and the like, and the first part 122 of the insulating layer 121 may include the inorganic material and the fluorine ion. Alternatively, the second part 124 of the insulating layer 121 may include an organic material including poly vinyl phenol ("PVP"), poly vinyl alcohol ("PVA"), polyimide and the like, and the first part 122 of the insulating layer 121 may include the organic material and the fluorine ion.

The thickness of the first part 122 may be smaller than the overall thickness of the insulating layer 121. In one exemplary embodiment, for example, a portion of the surface of a material for the insulating layer 121 may be hydrophobic-treat to form the hydrophobic first part 122. The thickness of the first part 122 may be controlled by the hydrophobic-treating process time and/or the condition of fluorine plasma. Alternatively, the thickness of the first part 122 may be substantially equal to the overall thickness of the insulating layer 121. However, the hydrophobic first part 122 and the hydrophilic second part 122 and 124 are both needed for defining a surface property of the insulating layer 121. Therefore, for reducing the hydrophobic-treating process time, the thickness of the first part 122 is preferably smaller than the overall thickness of the insulating layer 121.

The source electrode SE and the drain electrode DE are on the insulating layer 121, and the semi-conductor pattern AP is on the base substrate 110 including the source electrode SE and the drain electrode DE. The semi-conductor pattern AP may include an oxide semi-conductor or an organic semi-conductor. The semi-conductor pattern AP covers the source electrode SE, the drain electrode DE and the gap SA, so that a surface area of the semi-conductor pattern AP may be larger than a summation of surface areas of the source electrode SE, the drain electrode DE and the gap SA. In one exemplary embodiment, for example, a peripheral edge or boundary of the semi-conductor pattern AP may correspond with (e.g., be aligned with) a boundary of the first part and the second part 122 and 124 of the insulating layer 121, but is not limited thereto or thereby.

The semi-conductor pattern AP may be disposed on not only the second part 124 of insulating layer 121, but also a portion of the data line DL. In a process of forming the semi-conductor pattern AP, the data line DL has a large chemical affinity with an ink used in forming the semi-conductor pattern AP as compared with the first part 122 of the insulating layer 121, so that the ink may be partially disposed on the data line DL. By not only the hydrophilic property of the second part 124 of the insulating layer 121, but also the chemical affinity between the source electrode SE and the ink, and between the drain electrode DE and the ink, the semi-conductor pattern AP may be stably disposed on the second part 124 of the insulating layer 121.

The pixel electrode PE is on the over-coating layer 152 covering the semi-conductor pattern AP and the first part 122 of the insulating layer 121. The over-coating layer 152 includes the contact hole CNT partially exposing the drain electrode DE. When the semi-conductor pattern AP covers the whole drain electrode DE, the contact hole CNT may penetrate the over-coating layer 152 and the semi-conductor pattern AP to expose drain electrode DE. Alternatively, when the ink of the semi-conductor pattern AP covers only a portion of the drain electrode DE in a forming process of the semi-conductor pattern AP, a portion of the drain electrode DE is exposed through the contact hole CNT in the semi-conductor pattern AP. The pixel electrode PE contacts the exposed portion of the drain electrode DE through the contact hole CNT, so that the pixel electrode PE may be connected to the thin-film transistor SW.

Hereinafter, an exemplary embodiment of a method of manufacturing the thin-film transistor substrate 100 illustrated in FIG. 1 to FIG. 3 is described, referring to FIG. 4, FIG. 5A, FIG. 5B and FIG. 6 to FIG. 10.

Figure 4:
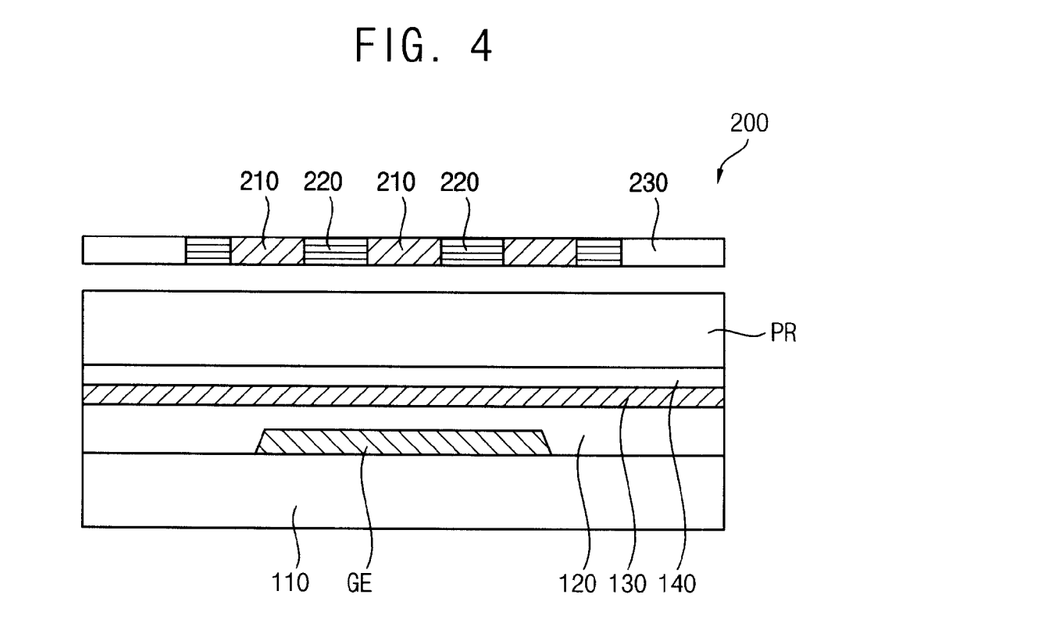
FIG. 4 is a cross-sectional view illustrating an exemplary embodiment of forming a photo pattern for a data pattern in a method of manufacturing the thin-film transistor illustrated in FIG. 3.

FIG. 4 is a cross-sectional view illustrating an exemplary embodiment of forming a photo pattern for a data pattern in a method of manufacturing the thin-film transistor illustrated in FIG. 3.

Referring to FIG. 4, the gate electrode GE connected to the gate line GL is formed on the base substrate 110. A gate metal layer may be patterned by a photo etching process to form a gate pattern including the gate line GL and the gate electrode GE, but is not limited thereto or thereby. The gate pattern includes the storage line STL including the second storage electrode CST2 and the connection line part CLP.

A mother insulating layer 120, an electrode layer 130, a sacrificing metal layer 140 and the photoresist layer PR are sequentially formed on the base substrate 110 including the gate pattern thereon. A mask 200 is disposed on the base substrate 110 including the photoresist layer PR thereon, and the photoresist layer PR is exposed using the mask 200.

The mother insulating layer 120 may include an inorganic material or an organic material, but is not limited thereto or thereby.

The electrode layer 130 may include a metal including gold (Au), copper (Cu), indium tin oxide (ITO) and the like, but is not limited thereto or thereby. When the electrode layer 130 includes copper, a buffer layer (not shown) which improves the adhesion between the electrode layer 130 and the mother insulating layer 120, may be employed.

The sacrificing metal layer 140 may include a metal which is not etched by an etching agent used to etch the electrode layer 130, the etching agent having the etching selectivity for the electrode layer 130. In one exemplary embodiment, for example, the sacrificing metal layer 140 may include molybdenum (Mo), but is not limited thereto or thereby.

The photoresist layer PR may include a positive photoresist composition. The mask 200 includes a light blocking portion 210, a translucent portion 220 and a light transmitting portion 230. When the photoresist layer PR is exposed to a light and developed by using the mask 200, the photoresist layer PR facing the light blocking portion 210 remains, the photoresist layer PR facing the translucent portion 220 is partially removed and the photoresist layer PR facing the light transmitting portion 230 is wholly removed, from the base substrate 110. In one exemplary embodiment, for example, when the thickness of a remaining photoresist layer PR facing the light blocking portion 210 is 1 after developing, the thickness of a remaining photoresist layer PR facing the translucent portion 220 may be less than 1 to more than 0, and the thickness of a remaining photoresist layer PR facing the light transmitting portion 230 may be 0.

Figure 5A:
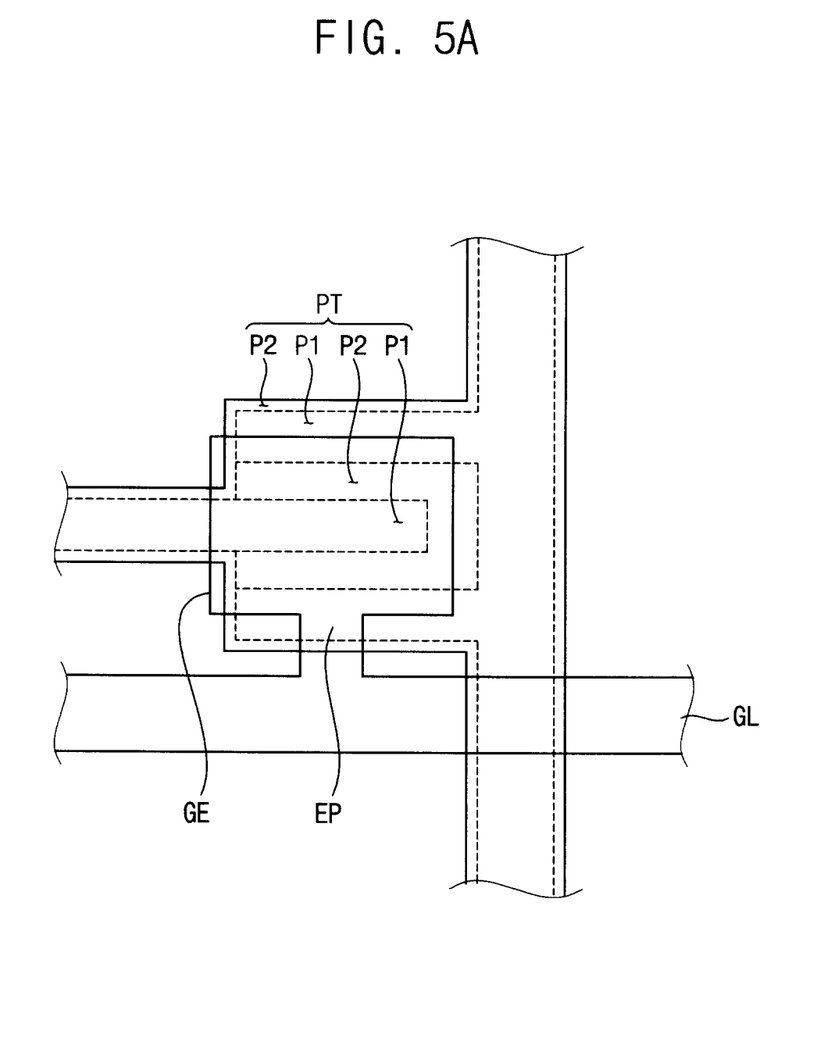
FIG. 5A is a plan view illustrating an exemplary embodiment of the photo pattern for forming the data pattern in the method of manufacturing the thin-film transistor substrate illustrated in FIG. 3.

FIG. 5A is a plan view illustrating an exemplary embodiment of a photo pattern for forming the data pattern in the method of manufacturing the thin-film transistor substrate illustrated in FIG. 3.

Figure 5B:
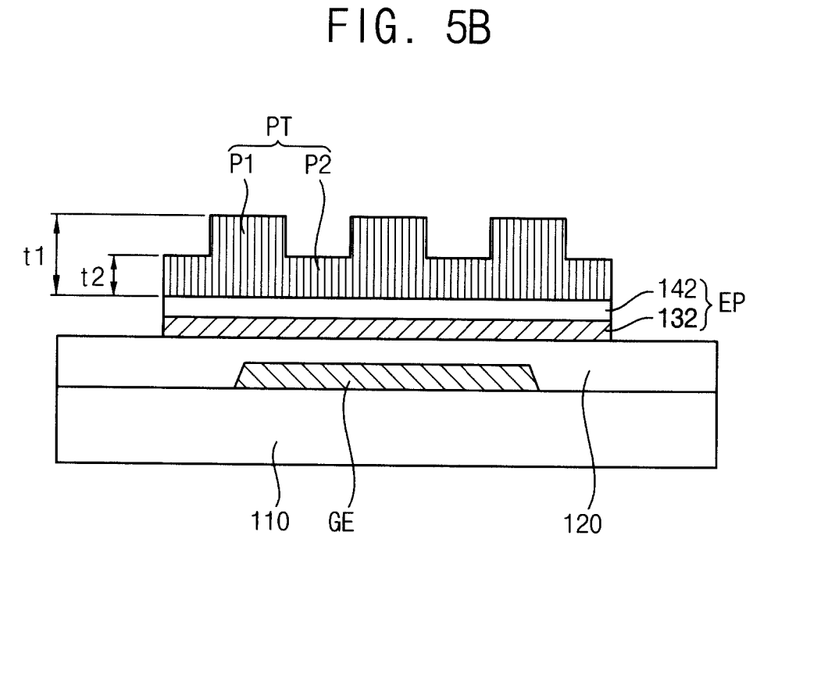
FIG. 5B is a cross-sectional view illustrating an exemplary embodiment of a first etching process in forming the data pattern in the method of manufacturing the thin-film transistor substrate illustrated in FIG. 3.

FIG. 5B is a cross-sectional view illustrating an exemplary embodiment of a first etching process in forming the data pattern in the method of manufacturing the thin-film transistor substrate illustrated in FIG. 3.

Referring to 5A and 5B, the photoresist layer PR is exposed to a light and developed to form the photoresist pattern PT. The photoresist pattern PT includes a first thickness portion P1 and a second thickness portion P2. The first thickness portion P1 is the thickest portion of the remaining photoresist layer PR, and the second portion P2 is thinner than the first portion P1. The first thickness portion P1 may have a first thickness t1, and the second thickness portion P2 may have a second thickness t2 which is thinner than the first thickness t1.

The first thickness t1 is disposed on areas including the source electrode SE, the drain electrode DE and the data line DL, and the second thickness portion T2 is disposed on an area facing the gap SA and a periphery of the source electrode SE, the drain electrode DE and the data line DL.

Therefore, a periphery of the photoresist pattern PT is formed to cover a periphery of the data line DL, the source electrode SE and the drain electrode DE referring to FIG. 5A and FIG. 5B. In FIG. 5, the photoresist pattern PT includes a solid line except for the solid line edges of the gate line GL and the gate electrode GE, and illustrates an area having the drain electrode DE. A dotted line illustrates edges of the source electrode SE, the drain electrode DE, the data line DL and the gap SA.

The sacrificing metal layer 140 and the electrode layer 130 are etched by using the photoresist pattern PT as an etching mask to form an electrode pattern EP and a preparatory line (not illustrated) being connected to the electrode pattern EP. The preparatory line is formed wider than the data line DL, in a subsequent process, and the data line DL is formed by using the preparatory line. In a process of forming the electrode pattern EP, a metal pattern, which is connected to the electrode pattern EP and disposed on the second storage electrode CST2, may be formed. In a subsequent process, the first storage electrode CST1 is formed by using the metal pattern.

Each of the electrode pattern EP and the preparatory line may include a first pattern 132 from the electrode layer 130 and a second pattern 142 from the sacrificing metal layer 140. The electrode pattern EP is disposed on an area, which will include the source electrode SE and the drain electrode DE, and the gap SA. In a process of forming the electrode pattern EP and the preparatory line, the sacrificing metal layer 140 and the electrode layer 130 may be patterned by using different etching agents in a wet etching process, but is not limited thereto or thereby.

FIGS. 6 to 10 are cross-sectional views illustrating exemplary embodiment of processes in the method of manufacturing the thin-film transistor substrate of FIG. 3 after the step of FIG. 5B.

Figure 6:
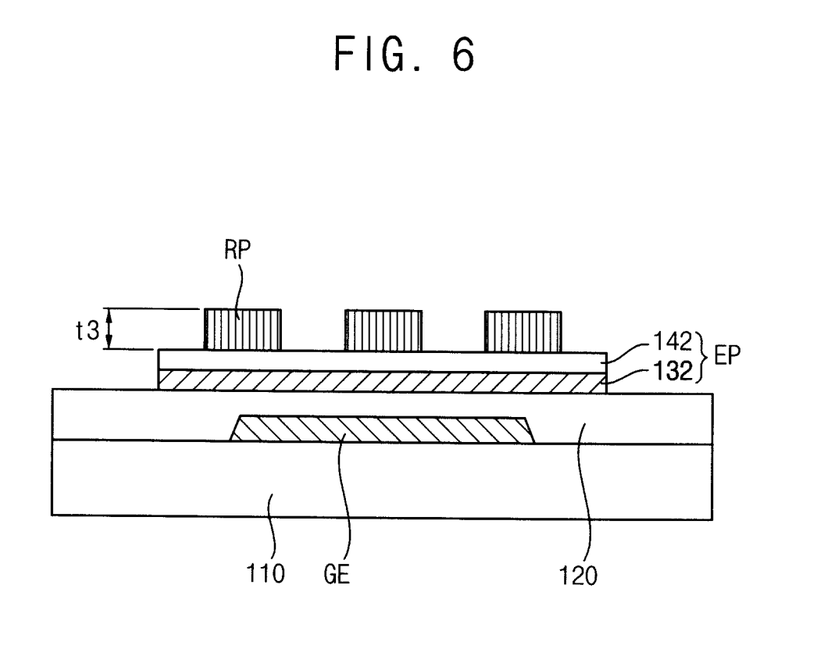
FIGS. 6 to 10 are cross-sectional views illustrating exemplary embodiments of processes in the method of manufacturing the thin-film transistor substrate of FIG. 3, after the step of FIG. 5B.

Referring to FIG. 6, a remaining photo pattern RP is formed by substantially completely removing the second thickness part P2 of the photoresist pattern PT. By removing the second thickness part P2, the thickness of the first thickness part P1 is reduces from the first thickness t1 such that the remaining photo pattern RP may have a third thickness t3 which is smaller than the first thickness t1. The second pattern 142 which is at a peripheral area of the gap SA, the electrode pattern EP and the data line DL, may be exposed using the remaining photo pattern RP.

Figure 7:
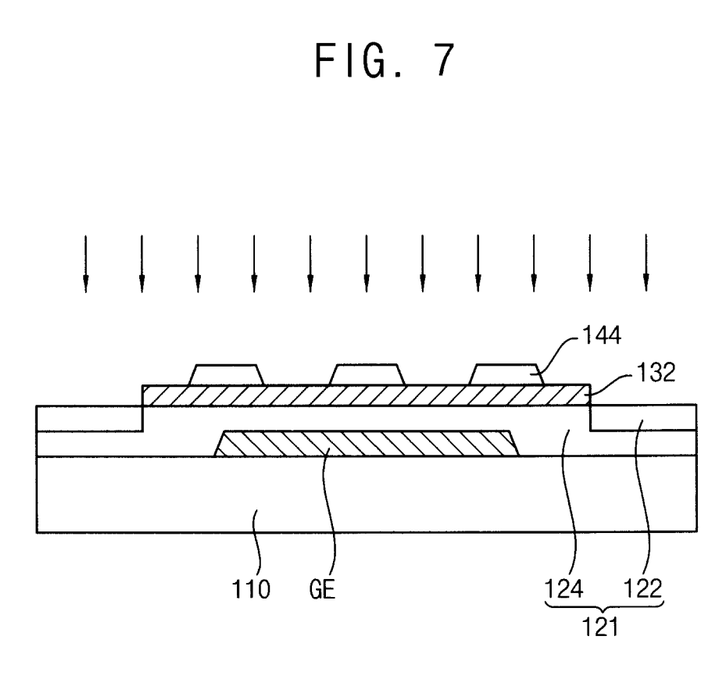

Referring to FIG. 7, the second pattern 142 may be etched by using the remaining photo pattern RP as an etching mask to form a third pattern 144. The third pattern 144 may expose a peripheral portion of the first pattern 132, and the first pattern 132 at the gap SA. After forming the third pattern 144, the remaining photo pattern RP may be removed.

The mother insulating layer 120 is hydrophobic-treated by using the third pattern 144 as a mask. In one exemplary embodiment, for example, the hydrophobic-treating process is performed by applying fluorine plasma (indicated by the downward arrows) to the mother insulating layer 120 on the base substrate 110. Therefore, fluorine ions are doped in a surface of the mother insulating layer 120, and the mother insulating layer 120 may be changed into the insulating layer 121 including the first part 122 and the second part 124. A final form of the insulating layer 121 may be defined by forming the first part 122 from the mother insulating layer 120. The first pattern 132 and the third pattern 144 is used as a mask during the hydrophobic-treating process, so that a portion of the mother insulating layer 120 facing the first pattern 132 and the third pattern 144, is not doped with fluorine ions. Thus, the first part 122 includes hydrophobic material by including fluorine ions, and the second part 124 includes an original material of the mother insulating layer 120 not including fluorine ions. Thus, the second part 124 has the hydrophilic property of the insulating layer 121.

After changing the mother insulating layer 120 to the insulating layer 121, the third pattern 144 is used as an etching mask to etch the first pattern 132.

Figure 8:
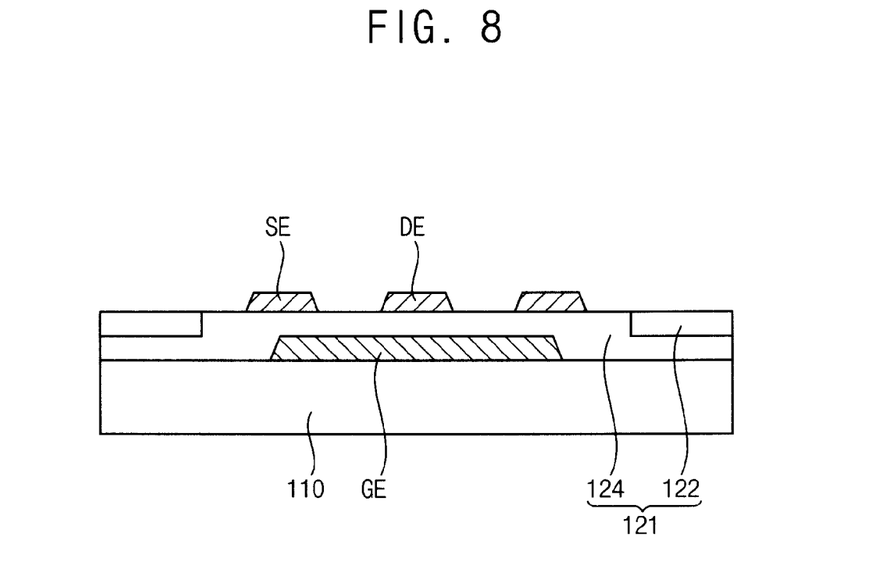

Referring to FIG. 8, the first pattern 132 is etched to form the source electrode SE, the drain electrode DE and the data line DL. In one exemplary embodiment, for example, after etching the first pattern 132, a data pattern, which includes the source electrode SE, the drain electrode DE and the data line DL illustrated in FIG. 1 to FIG. 3, is formed by removing the third pattern 144. The data pattern further includes the first storage electrode CST1.

Alternatively, when the third pattern 144 is not removed, each of the source electrode SE, the drain electrode DE and the data line DL may be a double layer structure including a first metal layer which is substantially identical to the electrode layer 130, and a second metal layer which is substantially identical to the sacrificing layer 140.

Figure 9:
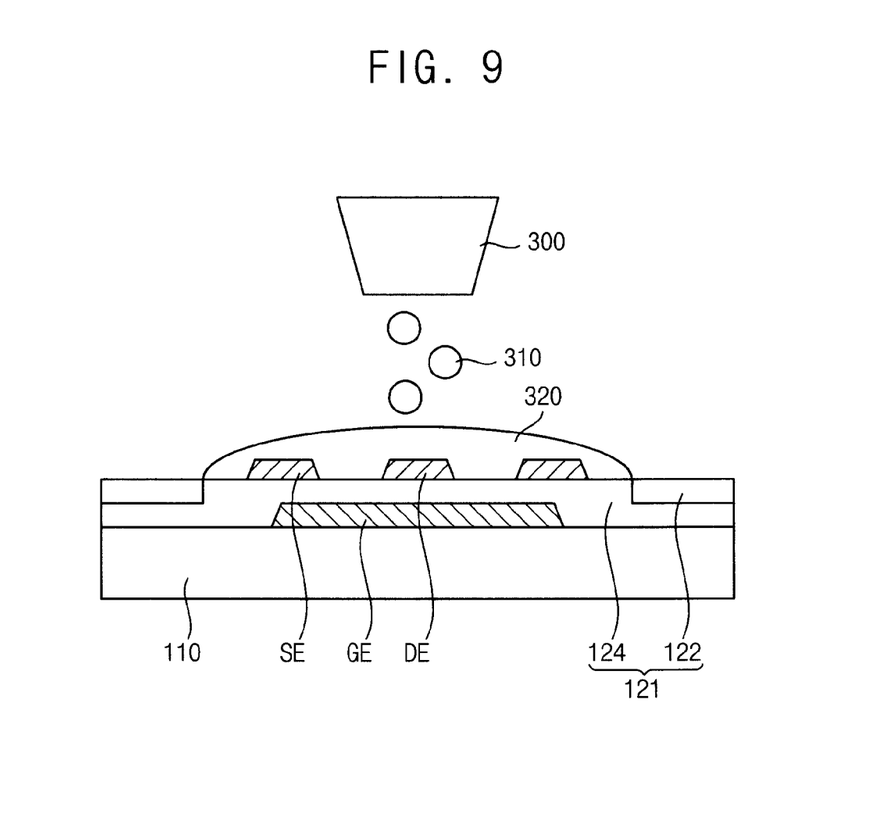

Referring to FIG. 9, an ink 310 is deposited onto the base substrate 110 having the data pattern thereon, such as by using a printer 300 to form a preparatory pattern 320. The ink 310 may be a solution which is an oxide semi-conductor or an organic semi-conductor dispersed in a solvent. Since the solvent has a hydrophilic material, the ink 310 has the hydrophilic material, so that the ink 310 is stably deposited on the second part 124 of the insulating layer 121. The second part 124 itself has a hydrophilic material and a surface of the source electrode SE and the drain electrode DE has a stronger hydrophilic material than the first part 122 of the insulating layer, so that the ink 310 may be stably disposed on not only the second part 124 exposed at the gap SA but also the source electrode SE and the drain electrode DE. Even though the ink 310 may not be exactly deposited on an area having the preparatory pattern 320, the chemical affinity between the hydrophobic first part 122 and the ink 310 is low such that the repulsive power therebetween is high, and the ink 310 is collected at the second part 124. Thus, the preparatory pattern 320 may be stably formed.

A portion of the preparatory pattern 320 disposed on the source electrode SE spreads toward a portion of the data line DL, because a surface of the data line DL has a hydrophilic property which is stronger than the hydrophobic first part 122.

Figure 10:
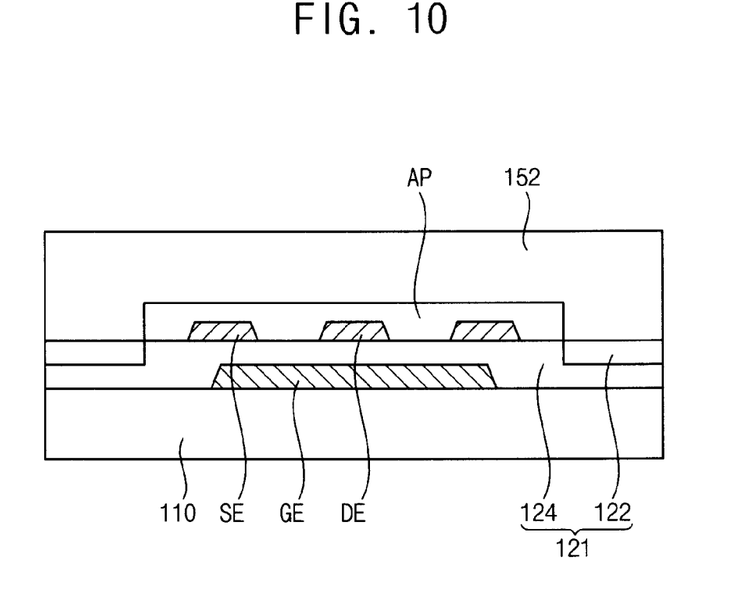

Referring to FIG. 10, the semi-conductor pattern AP may be formed by annealing the base substrate 110 including the preparatory pattern 320 thereon. Particularly, the semi-conductor pattern AP is formed by the ink 310, so that the semi-conductor pattern AP may have a planar shape. Referring to FIG. 2, the planar shape has a rounded corner, which is different from a pattern having a cross-sectional etching plane formed by a photo-etching process or a pattern having a two-dimensional pointed corner.

The over-coating layer 152 is formed on the base substrate 110 including the semi-conductor pattern AP thereon, and the over-coating layer 152 is patterned by a photo-etching process to form the contact hole CNT. The contact hole CNT may be formed to expose the drain electrode DE by penetrating the semi-conductor pattern AP and the over-coating layer 152.

Referring to FIG. 10 and FIG. 3, the pixel electrode PE is formed on the base substrate 110 including the contact hole CNT in the over-coating layer 152. In one exemplary embodiment, for example, a transparent electrode layer is patterned by a photo-etching process to form the pixel electrode PE, but is not limited thereto or thereby. The pixel electrode PE may contact the drain electrode DE through the contact hole CNT.

Thus, the thin film transistor substrate 100 illustrated in FIG. 1 and FIG. 3 may be manufactured.

Figure 11:
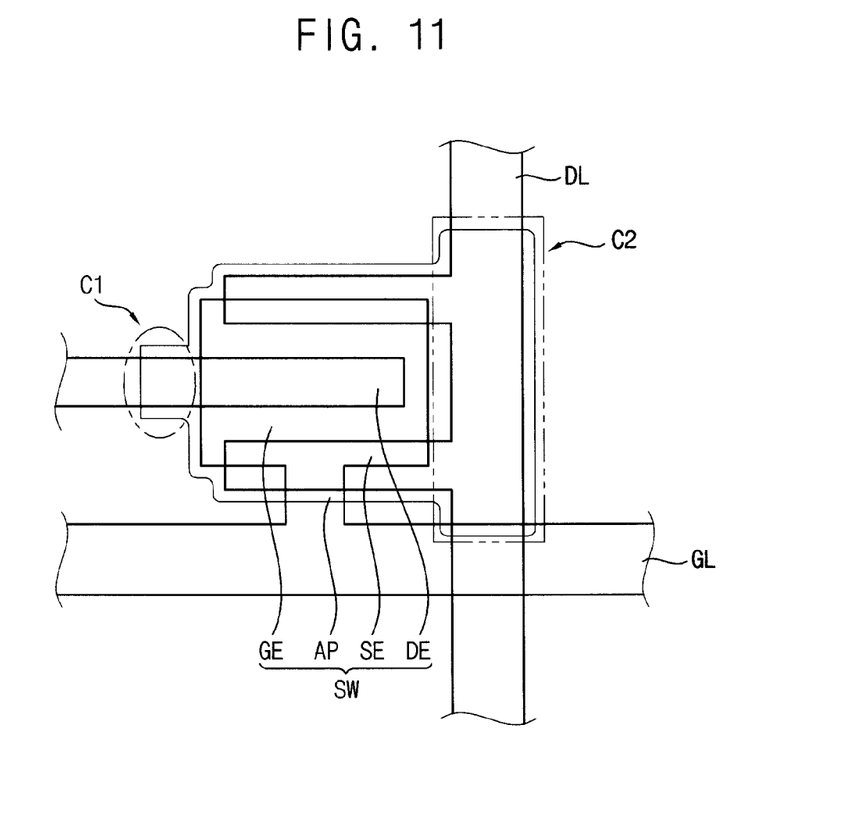
FIG. 11 is a plan view illustrating another exemplary embodiment of a thin-film transistor including a semi-conductor pattern according to the invention, which has different shape from the semi-conductor pattern illustrated in FIGS. 1 and 2.

FIG. 11 is a plan view illustrating another exemplary embodiment of a thin-film transistor including a semi-conductor pattern according to the invention, which has different shape from the semi-conductor pattern illustrated in FIGS. 1 and 2.

Referring FIG. 11, a thin-film transistor SW is substantially identical to a thin-film transistor SW illustrated in FIG. 1 and FIG. 2 except the planar shape of a semi-conductor pattern AP. The semi-conductor pattern AP illustrated in FIG. 11 is formed by using the ink 310, so that the semi-conductor pattern AP may have a planar shape including a rounded corner and may further include a first pattern portion C1 formed by a portion of the ink 310 spreading along a drain electrode DE. Furthermore, the semi-conductor pattern AP may further include a second pattern portion C2 formed by another portion of the ink 310 spreading across a data line DL. A rounded corner may be further at an area where outermost edges of the gate electrode GE and the drain electrode DE meet each other. Rounded corners may be further at an area of outermost edges of the data line DL opposite from the source electrode SE.

In a display substrate, when the thin-film transistor SW has a planar shape including a rounded corner, or includes the first pattern portion C1 or the second portion C2, the semi-conductor pattern AP is formed without using a bank by a process which is substantially identical to a described process illustrated in FIG. 9 and FIG. 10. Furthermore, in a display substrate, which is illustrated in FIG. 3, includes an insulating layer 121 including the hydrophobic first part and a hydrophilic second part 122 and 124, the semi-conductor pattern AP is formed without using a bank by a process which is substantially identical to a described process illustrated in FIG. 9 and FIG. 10.

According to the above, even though the ink 310 is used to form the semi-conductor pattern AP, the semi-conductor pattern AP is stably formed without a process of forming a bank. Therefore, the reliability and the productivity of the thin-film transistor are improved.

Figure 12:
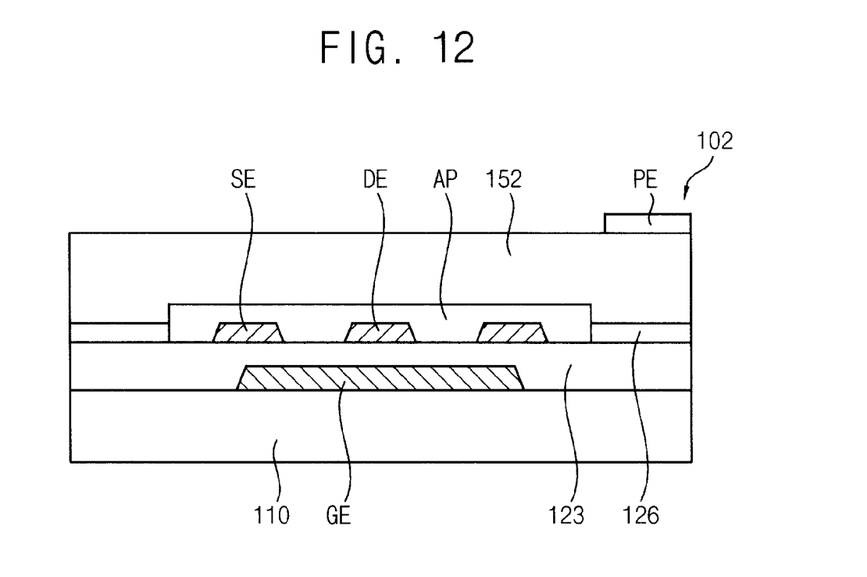
FIG. 12 is a cross-sectional view illustrating still another exemplary embodiment of a thin-film transistor substrate according to the invention.

FIG. 12 is a cross-sectional view illustrating still another exemplary embodiment of a thin-film transistor substrate according to the invention.

A plan view illustrating a thin-film transistor substrate 102 illustrated in FIG. 12 is substantially identical to a plan view illustrating a thin-film transistor substrate 100 illustrated in FIG. 1, and a thin-film transistor illustrated in FIG. 12 has a planar shape which is substantially identical to a thin-film transistor illustrated in FIG. 1. Thus, a plan view illustrating a thin-film transistor substrate 102 illustrated in FIG. 12 is omitted, and is described referring to FIG. 1 and FIG. 2.

Referring to FIG. 12, FIG. 1 and FIG. 2, the thin-film transistor substrate 102 includes a gate line GL, a data line DL, a thin-film transistor SW, a storage line STL, pixel electrode PE, insulating layer 123 and a hydrophobic pattern 126. The thin-film transistor substrate 102 includes the hydrophobic pattern 126 surrounding a semi-conductor pattern AP on the plan view, and is substantially identical to a thin-film transistor substrate 100 illustrated in FIG. 1 to FIG. 3 except that the insulating layer 123 insulating the gate line GL and the data line DL is simply an insulator between elements of the thin-film transistor substrate 102. Thus, any repetitive explanation concerning the above elements will be omitted.

The insulating layer 123 is on a base substrate 110 including a gate line GL, and a gate electrode GE connected to the gate line GL. The insulating layer 123 includes an inorganic material or an organic material. The insulating layer 123 has a planar area on the base substrate 110 different from a planar area of the insulating layer 121 which is illustrated in FIG. 3, where the insulating layer 121 illustrated in FIG. 3 includes the first part and the second part 122 and 124.

The hydrophobic pattern 126 is on the insulating layer 123, and a surface area of the insulating layer 123 except for an area overlapping the hydrophobic pattern 126 may have a hydrophilic property and/or material. In an exemplary embodiment, the hydrophobic pattern 126 itself includes a hydrophobic property and/or material, and may be formed by chemically combining material with a surface of the insulating layer 123.

A semi-conductor pattern AP of the thin-film transistor SW is formed on the hydrophilic area of the insulating layer 123, and the semi-conductor pattern AP may cover a source electrode SE and a drain electrode DE. In an exemplary embodiment, the semi-conductor pattern AP may be formed by spreading material for forming the semi-conductor pattern AP toward the data line DL to partially cover the data line DL as illustrated in FIG. 2 and FIG. 11.

Hereinafter, an exemplary embodiment of a method of manufacturing a thin film transistor illustrated in FIG. 12 will be described, referring to FIGS. 13 and 14.

Figure 13:
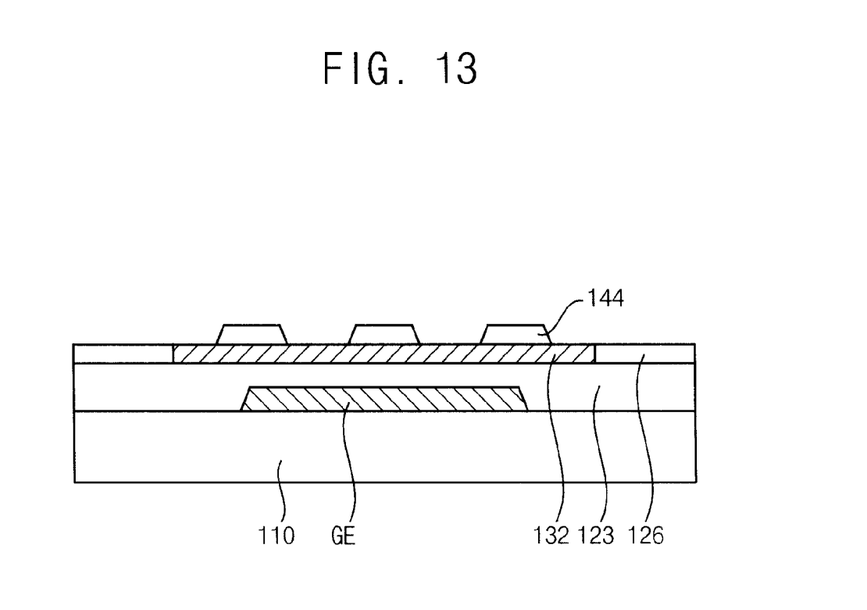
FIGS. 13 and 14 are cross-sectional views illustrating an exemplary embodiment of a method of manufacturing the thin-film transistor substrate illustrated in FIG. 12.
Figure 14:
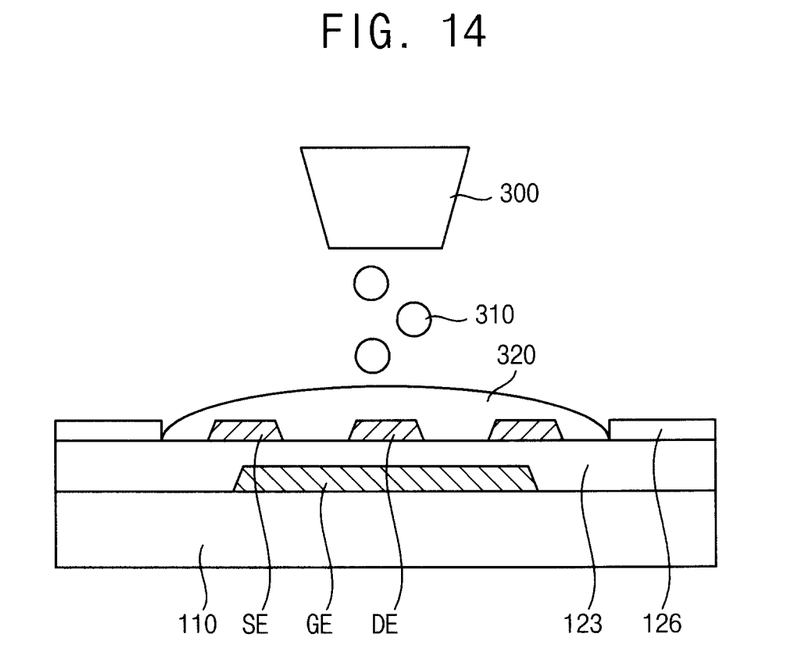

FIGS. 13 and 14 are plan views illustrating an exemplary embodiment of a method of manufacturing the thin-film transistor substrate 102 illustrated in FIG. 12.

In the thin-film transistor substrate 102, the gate electrode GE and the insulating layer 123 are formed on the base substrate 110, and a process of forming a first pattern 132 and a third pattern 144 on the insulating layer 123 is substantially the same to the previously described process in FIG. 4, FIG. 5A, FIG. 5B, FIG. 6 and FIG. 7. Thus, any repetitive explanation concerning the above elements will be omitted.

Referring to FIG. 13, after forming the first pattern and the third pattern 132 and 144 on the insulating layer 123, the hydrophobic pattern 126 is formed on the base substrate 110 including the first pattern and a third pattern 132 and 144 thereon. The hydrophobic pattern 126 may include a self-assembled monolayer ("SAM"), but is not limited thereto or thereby.

In one exemplary embodiment, for example, when a silane-based compound is applied to the base substrate 110 including the first pattern and the third pattern 132 and 144 thereon, a surface area of the insulating layer 123 except for an area overlapping the first pattern 132 is reacted with the silane-based compound, and the SAM is formed. Examples of the silane-based compound may include, but are not limited to, octadecyl trichlorosilane ("OTS"). In forming the hydrophobic pattern 126, a result is substantially identical to a result of hydrophobic-treating a surface of the mother insulating layer 120 illustrated in FIG. 4.

Referring to FIG. 14, the first pattern 132 is patterned using the third pattern 144 as a mask, so that the source electrode SE, the drain electrode DE and the data line DL may be formed. The insulating layer 123 at the gap SA may be partially exposed by forming the source electrode SE and the drain electrode DE. An ink 310 is deposited such by using a printer 300 on an area including the source electrode SE, the drain electrode DE and the gap SA, to form a preparatory pattern 320. Due toy the hydrophilic material of the ink 310, the preparatory pattern 320 is stably disposed on the area including the source electrode SE, the drain electrode DE and the gap SA.

Referring to FIG. 12 and FIG. 14, the base substrate 110 including the preparatory pattern 320 thereon is annealed, and an over-coating layer 152 and the pixel electrode PE are sequentially formed. The over-coating layer 152 may include a contact hole CNT (referring to FIG. 1) exposing the drain electrode DE.

Therefore, the thin film transistor substrate 102 illustrated in FIG. 12 may be manufactured.

According to the above, in forming the hydrophobic pattern 126, even though the semi-conductor pattern AP is formed by using the ink 310, the semi-conductor pattern AP is stably formed without a process forming a bank. Thus, the stability and the productivity of the thin-film transistor substrate 102 are improved.

According to one or more exemplary embodiment of the invention detailed above, a solution type semi-conductor pattern may be easily manufactured without employing a bank. Therefore, a method of forming a thin-film transistor substrate is simplified, and increasing a the total thickness of the thin-film transistor substrate including the semi-conductor pattern may be reduced or effectively prevented.

The foregoing is illustrative of the invention and is not to be construed as limiting thereof. Although exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a thin-film transistor substrate, the method comprising:
   providing a gate line, and a gate electrode connected to the gate line, on a base substrate;
   providing an insulating layer on the base substrate having the gate line and the gate electrode thereon;
   providing a data line and an electrode pattern on the base substrate having the insulating layer thereon, the data line extended in a direction crossing the gate line and the electrode pattern connected to the data line;
   hydrophobic-treating a surface of the insulating layer by using the data line and the electrode pattern as a mask;
   providing a source electrode and a drain electrode from the electrode pattern, the source electrode connected to the data line and the drain electrode spaced apart from the source electrode;
   providing a semi-conductor pattern overlapping the source electrode, the drain electrode and a gap between the spaced apart source and drain electrodes; and
   providing a pixel electrode on the base substrate having the semi-conductor pattern thereon, the pixel electrode connected to the drain electrode.

2. The method of claim 1, wherein the providing an electrode pattern comprises:
   providing an electrode layer on the base substrate having the insulating layer thereon;

providing a sacrificing metal layer on the base substrate having the electrode layer thereon;

etching the sacrificing metal layer and the electrode layer by using a photo pattern as an etching mask, the photo pattern formed on the sacrificing metal layer.

3. The method of claim 2, wherein the providing a source electrode and a drain electrode comprises:

removing a portion of the photo pattern to form a remaining pattern;

etching the sacrificing metal layer of the electrode pattern by using the remaining pattern as an etching mask to form sacrificing electrodes spaced apart from each other; and using the sacrificing electrodes as an etching mask to etch the electrode layer of the electrode pattern.

4. The method of claim 3, wherein the photo pattern comprises a first thickness portion, and the remaining pattern comprises a second thickness portion which is thinner than the first thickness portion, and wherein the second thickness portion of the remaining pattern is removed to expose the sacrificing metal layer at the gap.

5. The method of claim 3, wherein the providing a source electrode and a drain electrode further comprises removing the sacrificing electrodes, after the etching the electrode layer of the electrode pattern.

6. The method of claim 1, wherein the hydrophobic-treating a surface of the insulating layer comprises hydrophobic-treating a surface of the insulating layer exposed by the electrode pattern to form a first part of the insulating layer, and wherein a thickness of the first part is smaller than or substantially equal to a total thickness of the insulating layer, the first part having a hydrophobic property, and wherein a portion of the insulating layer below the electrode pattern has a hydrophilic property.

7. The method of claim 6, wherein the hydrophobic-treating a surface of the insulating layer exposed by the electrode pattern comprises treating the exposed insulating layer by fluorine plasma.

8. The method of claim 6, wherein the thickness of the first part is smaller than the total thickness of the insulating layer, and a lower portion of the insulating material below the first part has the hydrophilic property.

9. The method of claim 1, wherein the providing a semi-conductor pattern comprises:

depositing a semi-conductor solution on the base substrate having the source electrode and the drain electrode thereon; and thermal-treating the deposited semi-conductor solution on the base substrate.

10. The method of claim 9, wherein the semi-conductor solution covers the source electrode, the drain electrode and the gap between the spaced apart source and drain electrodes, and a portion of the semi-conductor solution spreads toward the data line.

11. The method of claim 1, wherein the hydrophobic-treating a surface of the insulating layer comprises providing a hydrophobic pattern on a surface of the insulating layer exposed by the electrode pattern.

12. The method of claim 11, wherein the hydrophobic pattern comprises a self-assembly monolayer.

* * * * *